US006622883B1

United States Patent
Wu et al.

(10) Patent No.: US 6,622,883 B1
(45) Date of Patent: Sep. 23, 2003

(54) DOOR FOR WAFER CONTAINER HAVING ROTATABLE CAMMED MEMBER AND MOVABLE LINKS

(75) Inventors: Tzong-Ming Wu, Taipei (TW); Jen-Rong Huang, Hsinchu (TW); Muh-Wang Liang, Miaoli Hsien (TW)

(73) Assignee: Industrial Technology Research Institute, Hsinchu (TW)

( * ) Notice: Subject to any disclaimer, the term of this patent is extended or adjusted under 35 U.S.C. 154(b) by 182 days.

(21) Appl. No.: 09/644,653

(22) Filed: Aug. 24, 2000

(30) Foreign Application Priority Data

Jun. 23, 2000 (TW) ........................ 89210759 U

(51) Int. Cl.⁷ .............................................. B65D 45/28
(52) U.S. Cl. ...................... 220/323; 220/200; 220/315; 206/710; 292/34; 292/36
(58) Field of Search ............................. 292/34, 36, 158; 220/323, 200, 315; 206/454, 710, 832; 414/407, 292

(56) References Cited

U.S. PATENT DOCUMENTS

| 3,884,515 A | * | 5/1975 | Ashkenazi | 292/34 |
| 5,472,246 A | * | 12/1995 | Puric | 292/36 |
| 5,482,161 A | * | 1/1996 | Williams et al. | 206/454 |
| 5,711,427 A | * | 1/1998 | Nyseth | 206/454 |
| 5,911,763 A | * | 6/1999 | Quesada | 292/36 |
| 5,915,562 A |   | 6/1999 | Nyseth et al. | |
| 5,957,292 A | * | 9/1999 | Mikkelsen et al. | 206/454 |
| 6,105,782 A | * | 8/2000 | Fujimori et al. | 206/710 |

* cited by examiner

Primary Examiner—Robin A. Hylton
(74) Attorney, Agent, or Firm—Rabin & Berdo, P.C.

(57) ABSTRACT

A Modified door for wafer container, includes a rotatable cammed member, two first links coupled to the rotatable cammed member and vertically aligned and moved in and out of respective first latch holes on the wafer transport module upon rotary motion of the rotatable cammed member, and two second links respectively coupled to the first links and horizontally moved in and out of respective second latch holes on the wafer transport module upon movement of the first links. The links each have a slope adapted to be moved with the respective link over a respective bearing means of the door body to force the door body inwards against the wafer transport module, keeping the wafer transport module well sealed.

20 Claims, 6 Drawing Sheets

US 6,622,883 B1

DOOR FOR WAFER CONTAINER HAVING ROTATABLE CAMMED MEMBER AND MOVABLE LINKS

BACKGROUND OF THE INVENTION

1. Field of the Invention

The present invention relates to a Modified door for a wafer container, and more particularly to such a door, which is practical for use with a wafer transport module that requires a high sealing status.

2. Description of Related Art

Various wafer transport modules with door means have been disclosed. An example is seen in U.S. Pat. No. 5,915, 562, entitled "Transport Module With Latching Door". The transport module can be made having a door on the middle, or two doors bilaterally disposed at the front side. The door comprises a rotatable cammed member having four sliding slots, and two sets of latch means respectively coupled to the sliding slots of the rotatable cammed member and vertically aligned. Each latch means comprises an elongated latch plate and an elongated lift plate. When rotating the rotatable cammed member, the latch plate and the lift plate are moved relative to each other (toward or apart from each other). The latch plate is adapted to engage into a respective latch hole on the transport module. The latch plate and the lift plate have a respective slope disposed in contact with each other. When moving the latch plate and the lift plate toward each other, the gap between the latch plate and the lift plate is relatively increased, and the door body is forced toward the inside of the transport module to seal the transport module. This door is complicated, and its manufacturing cost is high. Because the lift plate is movable, it tends to be forced out of position. Further, because the design of the rotatable cammed member and the latch means is operated to force two lateral sides of the door body against the transport module, it achieves less sealing effect.

SUMMARY OF THE INVENTION

The invention has been accomplished under the circumstances in view. It is the main object of the present invention to provide a Modified door for wafer container, which has a simple structure, and is suitable for mass production. To achieve this and other objects of the present invention, there is provided a wafer container door, comprising: a flat, rectangular door body, the door body comprising at least two peripheral sidewalls connected to one another, at least two bearing means respectively disposed at the peripheral sidewalls at an inner side, at least two guide means, a rotatable cammed member holder, at least one first slot and at least one second slot respectively extended through the peripheral sidewalls corresponding to the bearing means of the door body; a rotatable cammed member coupled to the rotatable cammed member holder, the rotatable cammed member comprising a center hub coupled to the rotatable cammed member holder, at least one coupling means each having a proximity end close to the hub, and a distal end far from the hub; at least one first link respectively coupled to the at least one coupling means of the rotatable cammed member and inserted through the at least one first slot of the door body, the at least one first link each comprising first coupling means coupled to the at least one coupling means of the rotatable cammed member, a sloped portion disposed at a bottom side thereof corresponding to the bearing means of the door body, a tongue inserted through one first slot of the door body, and second coupling means obliquely disposed at an outer side; and at least one second links respectively coupled to the at least one first link, the at least one second link each comprising coupling means respectively coupled to the second coupling means of the at least one first link, a sloped portion disposed at a bottom side thereof corresponding to the bearing means of the door body, and a tongue inserted through one second slot of the door body. Each coupling means of the rotatable cammed member can be an arched sliding slot, and the first coupling means of each first link can be a short axle coupled to one arched sliding slot of the rotatable cammed member. Alternatively, each coupling means of the rotatable cammed member can be an arched flange, and the first coupling means of each first link can be a sliding slot adapted to receive one arched flange of the rotatable cammed member. The second coupling means of each first link is an obliquely extended slot, and the coupling means of each second link is a short axle coupled to the obliquely extended slot of the corresponding first link. The bearing means can be formed integral with the door body. Alternatively, the bearing means can be separately prepared, and then coupled to the door body. The first and second links each have guide means. The door body has guide means matching with the guide means of the first and second links to guide movement of the first and second links upon rotary motion of the rotatable cammed member.

Figure 1:
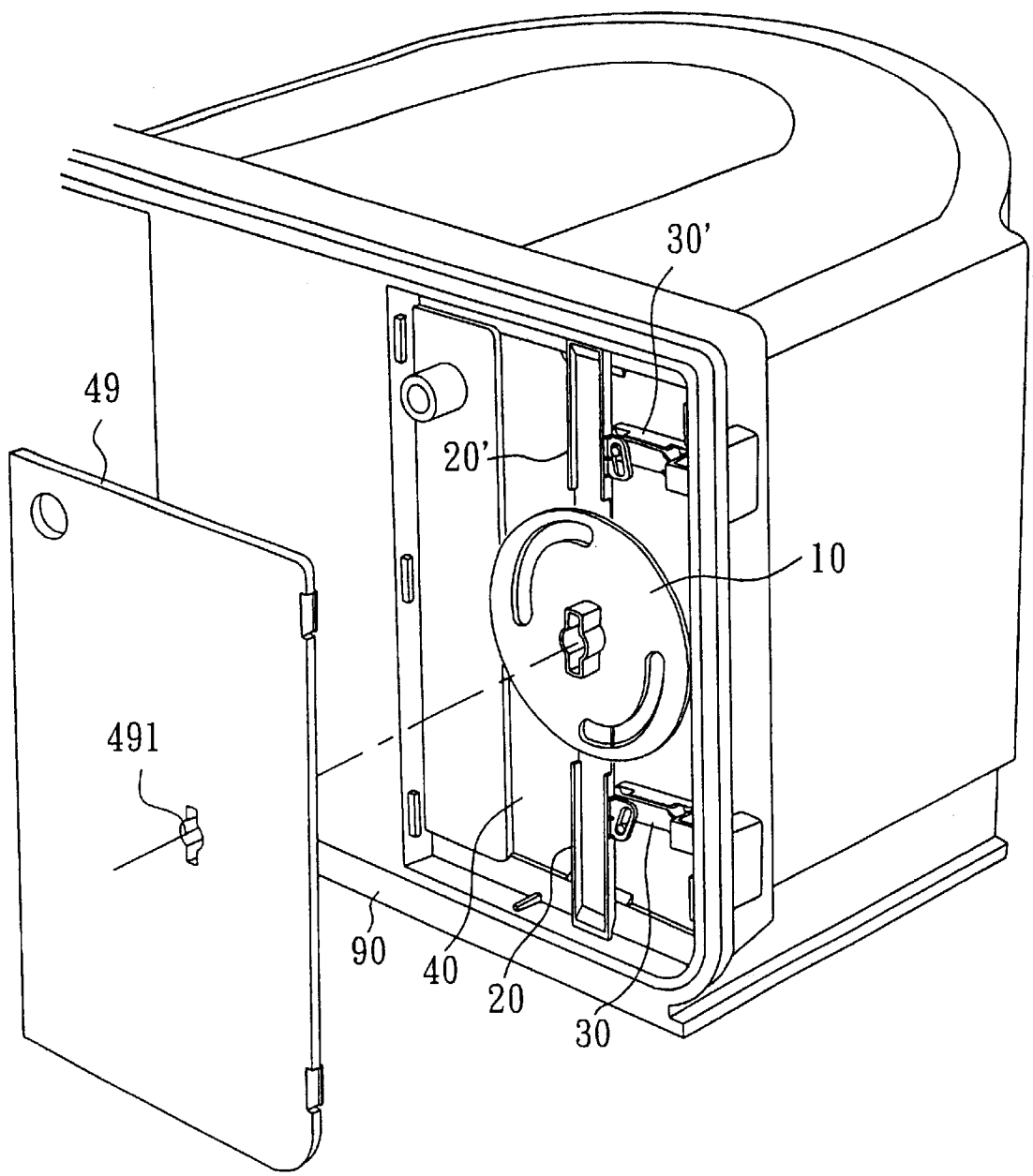
FIG. 1 is a perspective view of the present invention (before coupling of the door panel to the rotatable cammed member).
Figure 2:
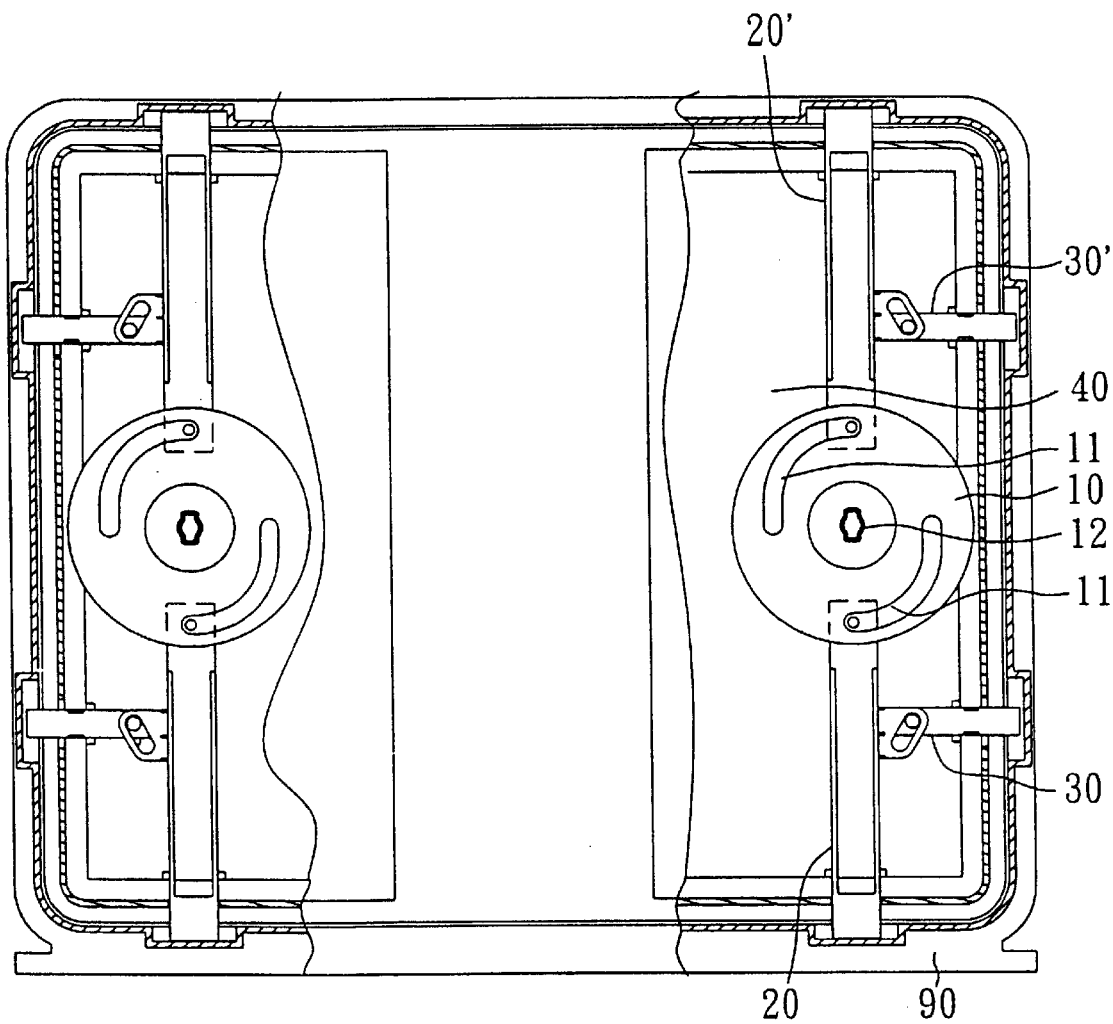
FIG. 2 is a front plain view of the present invention.
Figure 3:
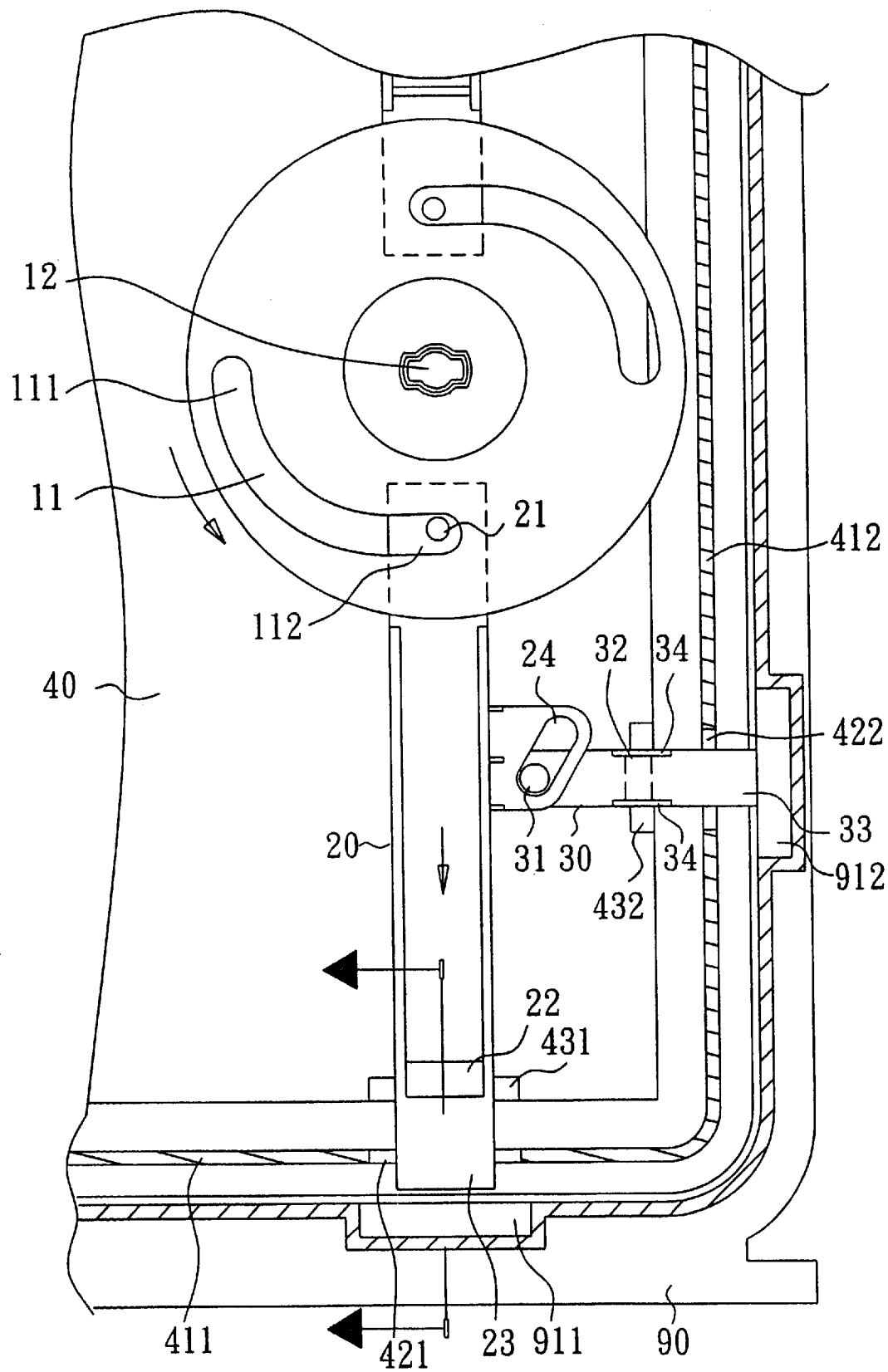
FIG. 3 is an enlarged view of a part of FIG. 2.

Referring to FIGS. from 1 through 4, a wafer transport module is shown having two doors bilaterally disposed at the front side (FIG. 1 shows one door only). Each door comprises a rotatable cammed member 10, two first links 20, 20', two second links 30, 30', a door body 40, and a door panel 49. The rotatable cammed member 10 comprises a hub 12, and two sliding slots 11. The hub 12 is driven by the user or a mechanical arm to rotate the rotatable cammed member 10. Each sliding slot 11 has a distal end 111 far away from the hub 12 of the rotatable cammed member 10, and a proximity end 112 near the hub 12 of the rotatable cammed member 10. The first links 20, 20' each have a top side, a bottom side, an inner side, an outer side, a tail end, a short axle 21 coupled to one sliding slot 11 of the rotatable cammed member 10, a sloped portion 22 disposed at the bottom side, a tongue 23 extended from the tail end, an oblique slot 24 disposed at the outer side, and guide means 25 disposed at the bottom side. The second links 30, 30', each have a top side, a bottom side, a tail end, a short axle 31 coupled to the oblique slot 24 of one first link 20, 20', a sloped portion 32 disposed at the bottom side, a tongue 33 extended from the tail end, guide means 35 disposed at the bottom side, and spring leaves 34 protruded from the bottom side and pressed on a part of the door panel 49 (see FIG. 3).

The door body 40 is a flat, rectangular device comprising a plurality of peripheral sidewalls 411 and 412 connected to one another, a plurality of bearing rails 431 and 432, and a rotatable cammed member holder 44. The peripheral sidewalls 411 and 412 each have a slot 421 or 422 adapted to receive the tongue 23 of the first links 20, 20' and the tongue 33 of the second links 30, 30' respectively. The bearing rails 431 and 432 are formed integral with the door body 40 corresponding to the sloped portion 22 of the first links 20, 20', and the sloped portion 32 of the second links 30, 30'. The rotatable cammed member holder 44 is adapted to receive the rotatable cammed member 10. The door panel 49 covers the door body 40, and includes a plughole 491 arranged to be in alignment with, and in front of, the hub 12 of the rotatable cammed member 10.

DETAILED DESCRIPTION OF THE PREFERRED EMBODIMENT

Referring to FIG. 3 again, when the short axle 21 of each first link 20, 20' is moved to the proximity end 112 of the corresponding sliding slot 11 of the rotatable cammed member 10, the tongue 23 of each first link 20, 20' is disengaged from the corresponding first latch hole 911 of the wafer transport module 90, and at the same time the short axle 31 of each second link 30 is constrained by the oblique slot 24 of the corresponding first link 20, 20' keeping the tongue 33 of each second link 30, 30', away from the corresponding second latch hole 912 of the wafer transport module 90.

Figure 4:
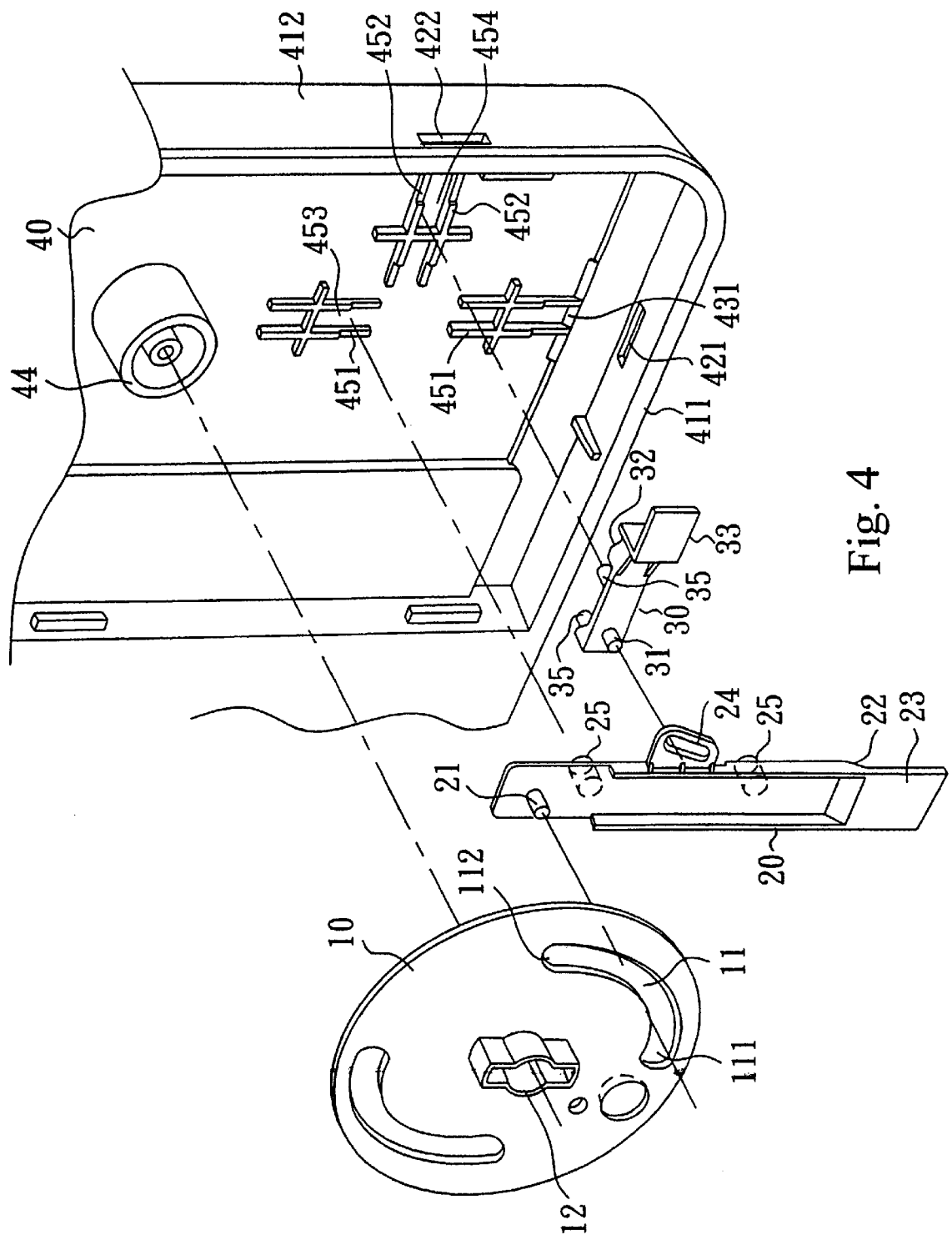
FIG. 4 is an exploded view of a part of FIG. 3.

Referring to FIG. 4 again, the bearing rails 431 are formed integral with the peripheral sidewalls 411 and 412 of the door body 40. The door body 40 further comprises first guide means 451 and second guide means 452 corresponding to the guide means 25 of the first links 20, 20', and the guide means 35 of the second links 30, 30'. The first guide means 451 and second guide means 452 define a respective sliding way 453 or 454 in which the guide means 25 of the first links 20, 20', and the guide means 35 of the second links 30, 30', are moved.

Figure 5A:
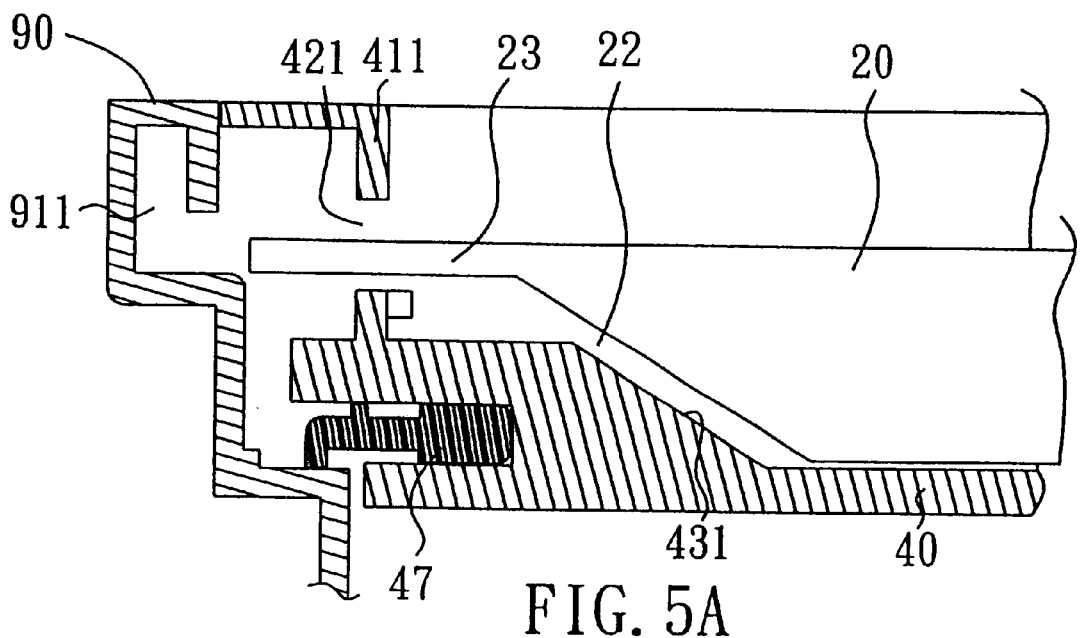
FIG. 5A is a sectional view of a part of the present invention, showing the position of the first link in the door body.
Figure 5B:
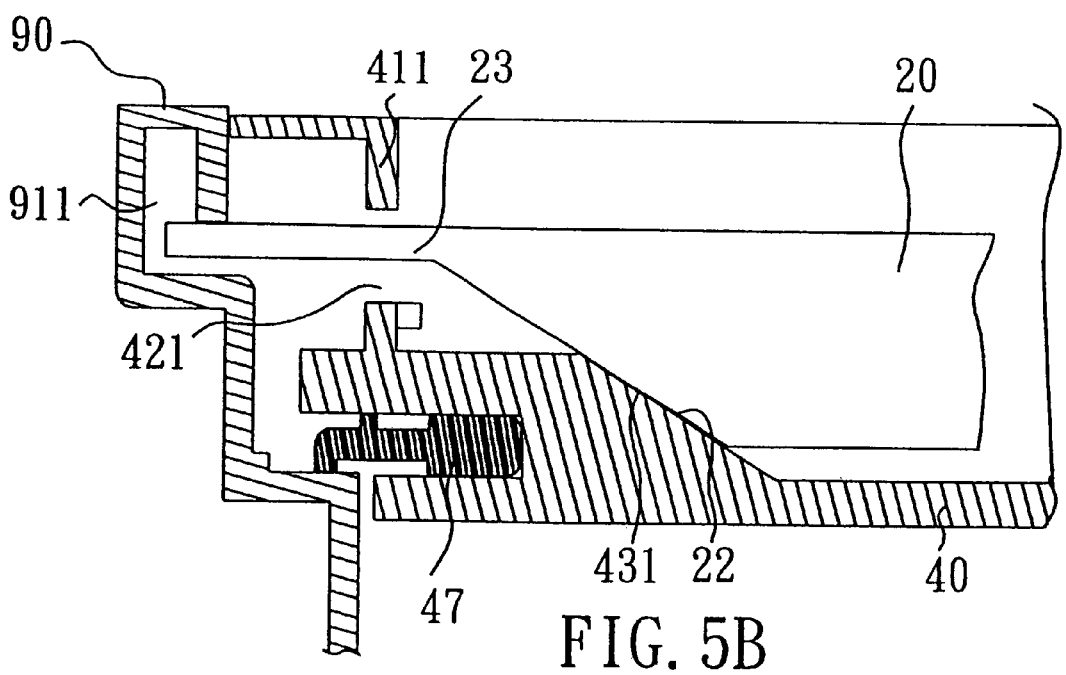
FIG. 5B is similar to FIG. 5A but shows the slope of the first link moved over the corresponding bearing rail, with the tongue of the first link being engaged into the respective latch hole of said wafer transport module.

FIGS. 5A and 5B show the status of the door before and after rotation of the rotatable cammed member 10. In FIG. 5A, the sloped portion 22 of the first link 20, 20', does not touch the corresponding bearing rail 431, and the tongue 23 of the first link 20, 20', is disengaged from the corresponding first latch hole 911 of the wafer transport module 90 (see also FIG. 3). After rotation of the rotatable cammed member 10, as illustrated in FIG. 5B, the tongue 23 of the first link 20, 20', is engaged into the corresponding first latch hole 911 of the wafer transport module 90, the sloped portion 22 of the first link 20, 20', is disposed in close contact with the corresponding bearing rail 431, the first link 20, 20', is lifted to force the door body 40 against the wafer transport module 90 (see also FIG. 3). When the first links 20, 20', and the wafer transport module 90 are closed tightly, the sloped portion 22 of each first link 20, 20', imparts a downward pressure to the door body 40, keeping the sealing rubber 47 firmly pressed on the water transport module 90 to seal the gap.

Figure 6:
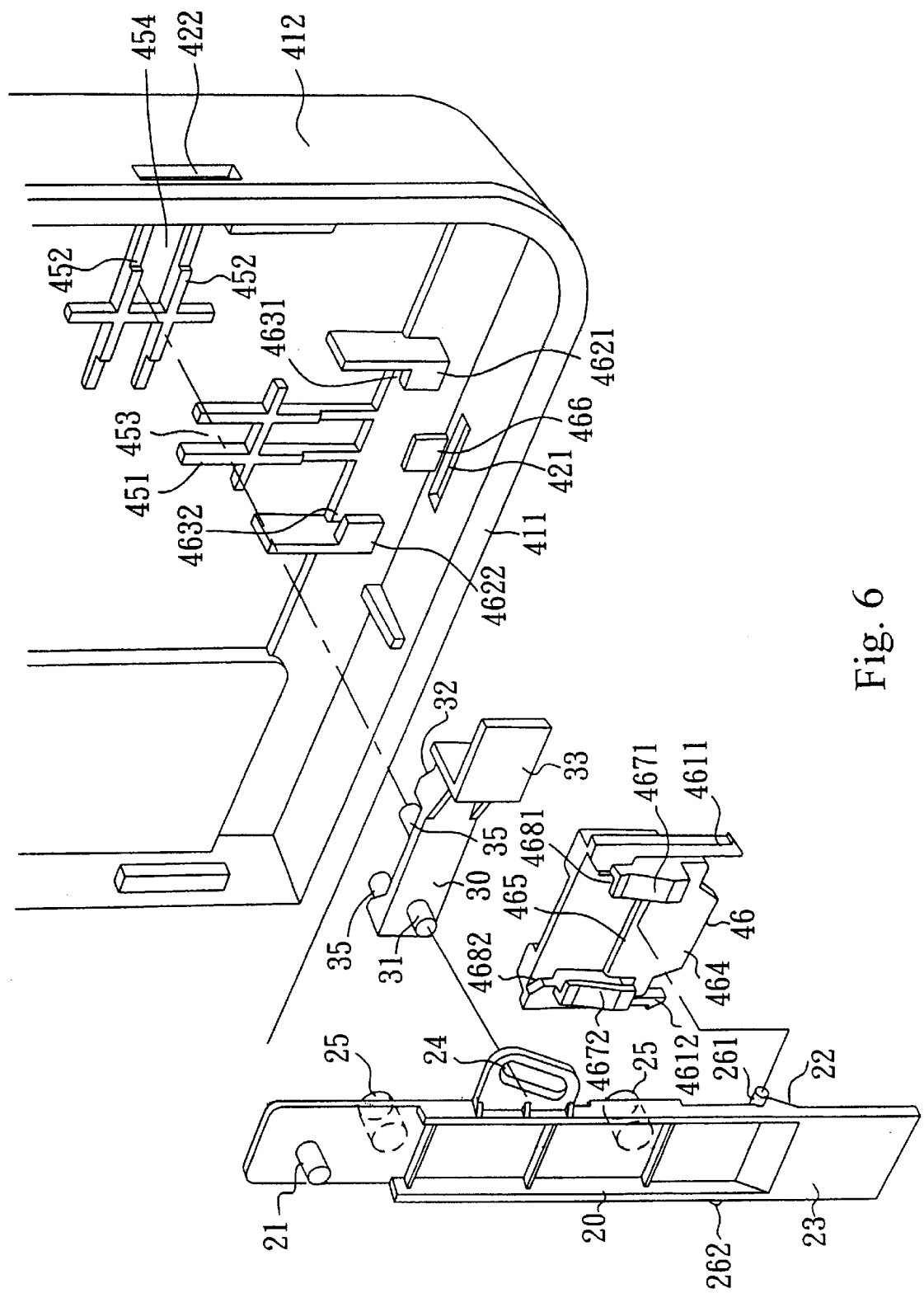
FIG. 6 is an exploded view of an alternate form of the present invention.

FIG. 6 shows an alternate form of the present invention. According to this alternate form, bearing blocks 46 are detachably coupled to the door body 40 to support the links 20 and 30 instead of the aforesaid bearing rails 431 and 432. Each bearing block 46 comprises two side rails 4611 and 4612 respectively inserted into respective coupling grooves 4631 and 4632 in respective coupling blocks 4621 and 4622 at the door body 40, a front positioning flange 464 inserted into the gap defined between a respective locating block 466 at the door body 40 and a part of the door body 40, two locating flanges 4671 and 4672 respectively raised from the side rails 4611 and 4612, two sliding grooves 4681 and 4682 respectively defined between the locating flanges 4671 and 4672 and the side rails 4611 and 4612, and a protruded wall portion 465 adapted to act against the sloped 22 of the corresponding first link 20. Each first link 20 further comprises a transverse sliding rod 261 moved with the respective first link 20 in the sliding grooves 4681 and 4682 between the locating flanges 4671 and 4672 of the respective bearing block 46.

What is claimed is:

1. A modified door for a wafer container, comprising:
   a rectangular, flat door body comprising at least two peripheral sidewalls connected to one another, at least two bearings respectively disposed at inner sides of said peripheral sidewalls, at least two guides, a rotatable cammed member holder, and at least one first slot and at least one second slot respectively extending through said peripheral sidewalls, each slot corresponding to a respective bearing of said door body;
   at least one rotatable cammed member coupled to said rotatable cammed member holder, said rotatable cammed member comprising at least one sliding slot;
   at least one first link having an end coupled to the sliding slot of said rotatable cammed member and being insertable through said at least one first slot of said door body, said first link having a guide disposed at a bottom side thereof and being adapted to move with the first link in one of the guides of said door body for enabling the first link to be moved in the first slot of said door body upon rotary motion of said rotatable cammed member, and an oblique slot disposed at an outer side of said first link; and
   at least one second link respectively coupled to said at least one first link, said at least one second link having one end respectively coupled to the oblique slot of said at least one first link, said second link having a guide disposed at a bottom side thereof and being adapted to move with the second link in another one of the guides of said door body for enabling the respective second link to be moved in the second slot of said door body upon rotary motion of said rotatable cammed member.

2. The door of claim 1, wherein said first link has a sloped portion disposed at a bottom side thereof, the sloped portion being adapted to be moved with the first link over one of the bearings of said door body to force said door body against a wafer transport module.

3. The door of claim 1, wherein said at least one first link comprises a tail end, and a tongue extending from said tail end and being insertable through said at least one first slot of said door body.

4. The door of claim 1, wherein said at least one second link comprises a sloped portion, which forces the second link upwards when the second link and sloped portion are over one of the bearings of said door body, thereby keeping said door body pressed against a wafer transport module.

5. The door of claim 1, wherein said at least one second link comprises a tail end, and a tongue extending from the tail end and being insertable through said at least one second slot of said door body.

6. The door of claim 1, wherein said rotatable cammed member comprises a hub disposed at the center thereof, the hub being coupled to said rotatable cammed member holder for enabling said rotatable cammed member to be rotated on said rotatable cammed member holder.

7. The door of claim 1, wherein the at least one sliding slot of said rotatable cammed member is an arched sliding slot, and said at least one first link has a short axle raised from one end thereof and respectively coupled to the at least one sliding slot of said rotatable cammed member for enabling said at least one first link to be moved axially upon rotary motion of said rotatable cammed member.

8. The door of claim 1, wherein said at least two bearings are respectively formed integral with the at least two peripheral sidewalls of said door body.

9. The door of claim 1, wherein said at least two bearings includes at least one bearing block separately made and respectively coupled to the inner sides of the at least two peripheral sidewalls of said door body.

10. The door of claim 9, wherein said door body comprises at least one pair of coupling blocks each defining a coupling groove, and said at least one bearing block comprises two side rails respectively inserted into respective coupling grooves in said at least one pair of coupling blocks of said door body.

11. The door of claim 9, wherein said door body comprises at least one locating block defining, with a part of said door body, a gap, and said at least one bearing block has a front end respectively engaged into the gap between said at least one locating block and said door body.

12. The door of claim 9, wherein said at least one bearing block comprises two locating flanges respectively raised from the side rails and defining a respective sliding groove, said at least one first link comprises a transverse sliding rod adapted to be moved with the respective first link in the sliding groove between the locating flanges of said at least one bearing block.

13. The door of claim 1, wherein said at least one first link comprises a short axle disposed at one end and being movable With the respective first link in the at least one sliding slot of said rotatable cammed member.

14. The door of claim 1, wherein said at least one second link comprises a short axle disposed at one end and being movable with the respective second link in the oblique slot of said at least one first link.

15. The door of claim 6, further comprising a door panel covering said door body.

16. The door of claim 15, wherein said door panel comprises a plughole arranged to be in alignment with the hub of said rotatable cammed member.

17. The door of claim 1, wherein said guide of said at least one first link is integral with the bottom side of said first link, said guide of said first link being received within the one of the guides of said door body so that the guide of said at least one first link is guided upon movement of said at least one first link.

18. The door of claim 1, wherein said guide of said at least one second link is integral with the bottom side of said second link so that the guide of said at least one second link is guided upon movement of said at least one second link with said first link.

19. The door of claim 1, wherein said at least one second link comprises a spring protruding from the bottom side of said second link and pressing on a part of said door panel.

20. A door for a wafer container, comprising:

a door body comprising at least two peripheral sidewalls connected to one another, at least two guides, a rotatable cammed member holder, a first slot formed in one of the sidewalls, and a second slot formed in another one of the sidewalls;

a rotatable cammed member coupled to the rotatable cammed member holder, the rotatable cammed member having at least one sliding slot;

a first link having an end coupled to the sliding slot of the rotatable cammed member, the first link having a guide disposed at a bottom side thereof, the guide moving in one of the guides of the door body for guiding the first link into and out of the first slot when the rotatable cammed member is rotated, the first link further having an oblique slot disposed at an outer side thereof; and a second link having one end coupled to the oblique slot of the first link, the second link having a guide disposed at a bottom side thereof, wherein when the first link is moved due to rotation of the rotatable cammed member, the oblique slot of the first link causes the second link to move into and out of the second slot, with the guide of the second link moving in another one of the guides of the door body during such movement.

* * * * *